US011862569B2

(12) United States Patent
Kirby et al.

(10) Patent No.: US 11,862,569 B2
(45) Date of Patent: Jan. 2, 2024

(54) FRONT END OF LINE INTERCONNECT STRUCTURES AND ASSOCIATED SYSTEMS AND METHODS

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 17/325,069

(22) Filed: May 19, 2021

(65) Prior Publication Data

US 2022/0068819 A1    Mar. 3, 2022

Related U.S. Application Data

(60) Provisional application No. 63/071,969, filed on Aug. 28, 2020.

(51) Int. Cl.
*H01L 23/538*   (2006.01)
*H01L 21/50*    (2006.01)
(Continued)

(52) U.S. Cl.
CPC .......... *H01L 23/5384* (2013.01); *H01L 21/50* (2013.01); *H01L 21/76802* (2013.01);
(Continued)

(58) Field of Classification Search
CPC .......... H01L 27/0688; H01L 27/11551–11556; H01L 27/11563; H01L 27/11578–11582;
(Continued)

(56) References Cited

U.S. PATENT DOCUMENTS 10,199,326 B1 *  2/2019  Ohsaki .................. H10B 43/20
10,354,980 B1    7/2019  Mushiga et al.
(Continued)

OTHER PUBLICATIONS

International Search Report and Written Opinion dated Feb. 22, 2022 for International Patent Application No. PCT/US2021/046455, 19 pages.
(Continued)

*Primary Examiner* — Bac H Au
(74) *Attorney, Agent, or Firm* — Perkins Coie LLP

(57) ABSTRACT

Systems and methods for a semiconductor device having a front-end-of-line interconnect structure are provided. The semiconductor device may include a dielectric material having a backside formed on a front side of a semiconductor or silicon substrate material and a front side, and a conducting material on the front side of the dielectric material. The conducting material may have a line portion and an interconnect structure electrically coupled to the line portion and separated from the front side of the substrate material by the dielectric material. The interconnect structure has a backside defining a contact surface. The semiconductor device may further include a semiconductor die proximate the front side of the dielectric material, an insulating material encasing at least a portion of the semiconductor die, and an opening through which the active contact surface at the backside of the interconnect structure is exposed for electrical connection.

11 Claims, 14 Drawing Sheets

(51) Int. Cl.
  *H01L 21/768* (2006.01)
  *H01L 27/06* (2006.01)
  *H01L 27/092* (2006.01)

(52) U.S. Cl.
  CPC .... *H01L 21/76877* (2013.01); *H01L 23/5386* (2013.01); *H01L 27/0688* (2013.01); *H01L 27/092* (2013.01)

(58) Field of Classification Search
  CPC .............. H10B 41/20–27; H10B 43/00; H10B 43/20–27
  See application file for complete search history.

(56) References Cited

U.S. PATENT DOCUMENTS

| | | | |
|---|---|---|---|
| 10,629,616 B1 * | 4/2020 | Kai | H10B 43/10 |
| 10,903,164 B2 * | 1/2021 | Nishida | H01L 27/0688 |
| 11,171,097 B2 * | 11/2021 | Said | H01L 25/50 |
| 11,195,857 B2 * | 12/2021 | Kai | H10B 41/10 |
| 11,201,107 B2 * | 12/2021 | Okina | H01L 24/08 |
| 11,322,466 B2 * | 5/2022 | Okina | H01L 23/585 |
| 11,355,486 B2 * | 6/2022 | Mizutani | H01L 25/0657 |
| 2007/0032059 A1 | 2/2007 | Hedler et al. | |
| 2011/0031633 A1 | 2/2011 | Hsu et al. | |
| 2011/0089572 A1 | 4/2011 | Tezcan et al. | |
| 2012/0132967 A1 | 5/2012 | Andry et al. | |
| 2015/0102497 A1 | 4/2015 | Park et al. | |
| 2015/0380339 A1 | 12/2015 | Zhao et al. | |
| 2017/0179026 A1 * | 6/2017 | Toyama | H10B 43/50 |
| 2018/0145030 A1 | 5/2018 | Beyne et al. | |
| 2019/0051599 A1 | 2/2019 | Zhang et al. | |
| 2019/0296041 A1 * | 9/2019 | Yamasaka | H01L 27/0688 |
| 2020/0020684 A1 | 1/2020 | Chen et al. | |
| 2020/0098776 A1 | 3/2020 | Sugisaki | |
| 2020/0258816 A1 | 8/2020 | Okina et al. | |
| 2020/0258904 A1 * | 8/2020 | Kai | H10B 41/41 |
| 2020/0266146 A1 | 8/2020 | Nishida | |
| 2020/0295037 A1 * | 9/2020 | Iijima | H01L 23/5226 |
| 2020/0381384 A1 * | 12/2020 | Huo | H01L 23/5384 |
| 2021/0035965 A1 * | 2/2021 | Mizutani | H01L 25/18 |
| 2021/0327807 A1 * | 10/2021 | Chen | H01L 21/76898 |
| 2022/0068765 A1 | 3/2022 | Kirby et al. | |
| 2022/0068820 A1 | 3/2022 | Kirby et al. | |

OTHER PUBLICATIONS

International Application No. PCT/US2021/046461—International Search Report and Written Opinion, dated Dec. 10, 2021, 13 pages.

* cited by examiner

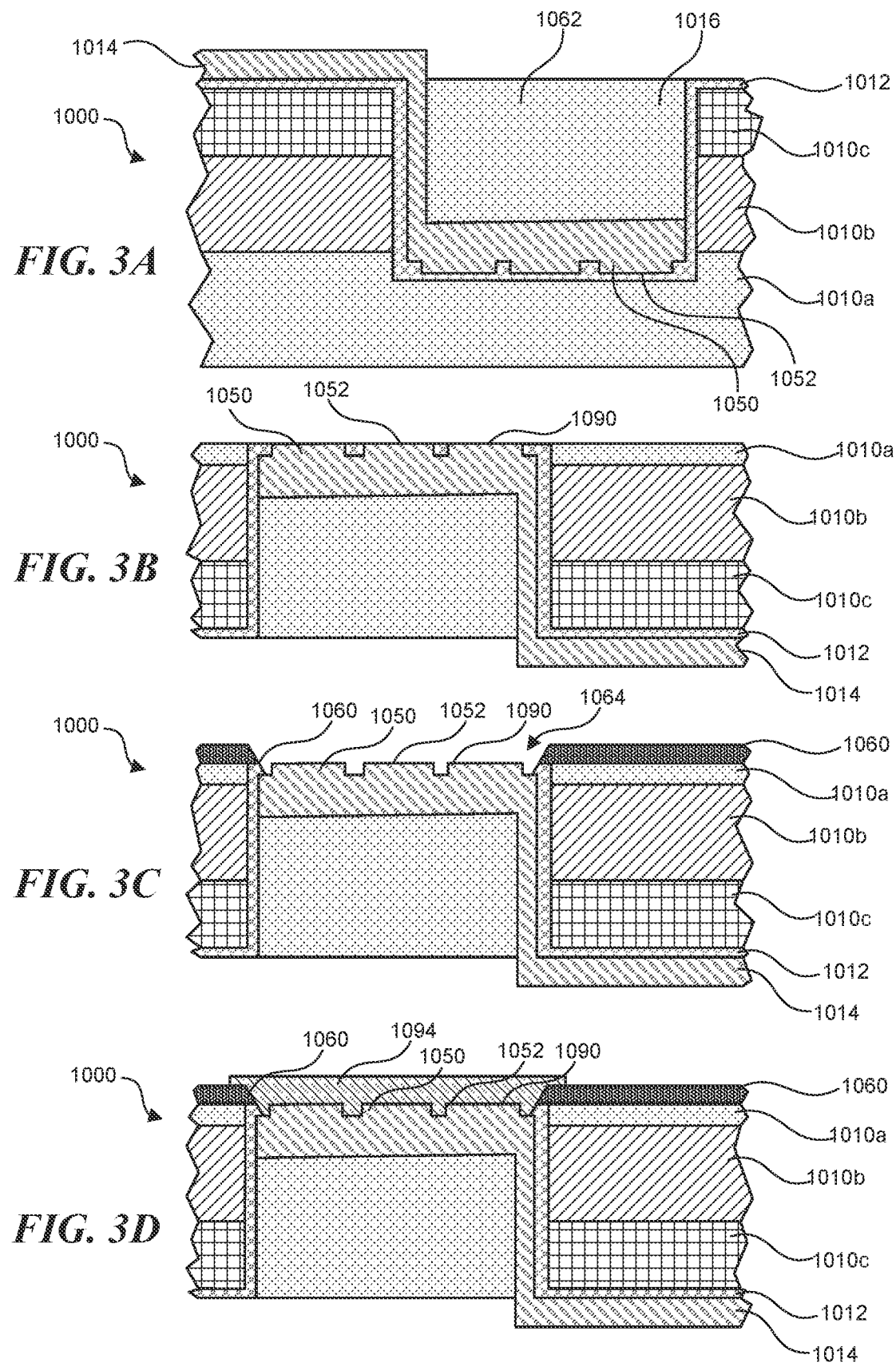

FRONT END OF LINE INTERCONNECT STRUCTURES AND ASSOCIATED SYSTEMS AND METHODS

CROSS-REFERENCE TO RELATED APPLICATION

This application claims the benefit of U.S. Provisional Patent Application No. 63/071,969, filed on Aug. 28, 2020, which is incorporated herein by reference in its entirety.

TECHNICAL FIELD

The present disclosure is generally directed to semiconductor devices, and in several embodiments, more particularly to systems and methods of forming pre-positioned front-end-of-line interconnect structures for backside electrical connections.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted. In vertical semiconductor die stack assemblies, through-silicon vias (TSV) are often used to make an electrical connection through a die.

In semiconductor device fabrication, front-end-of-line (FEOL) processing is used to form individual devices (transistors, capacitors, resistors, etc.) at the active side of the semiconductor substrate. In conventional semiconductor device assemblies, back-end-of-line (BEOL) processing of the substrate is used to form various interconnects for backside electrical connections, e.g., through silicon vias, metalization layers, bond pads, etc. Conventional BEOL processing methods for forming interconnects require extensive processing time and complex fabrication operations, and they also have limited design options for routing configurations. BEOL processing generally occurs immediately before a probe stage, where signals are physically acquired from the internal nodes of a semiconductor device for failure analysis and defect detection.

BRIEF DESCRIPTION OF THE DRAWINGS

FIGS. 3A-3D are enlarged cross-sectional views of the portion of the semiconductor device shown in FIG. 2F, showing various stages of fabricating a semiconductor device having a front-end-of-line interconnect structure in accordance with embodiments of the present technology.

DETAILED DESCRIPTION

Figure 1A:
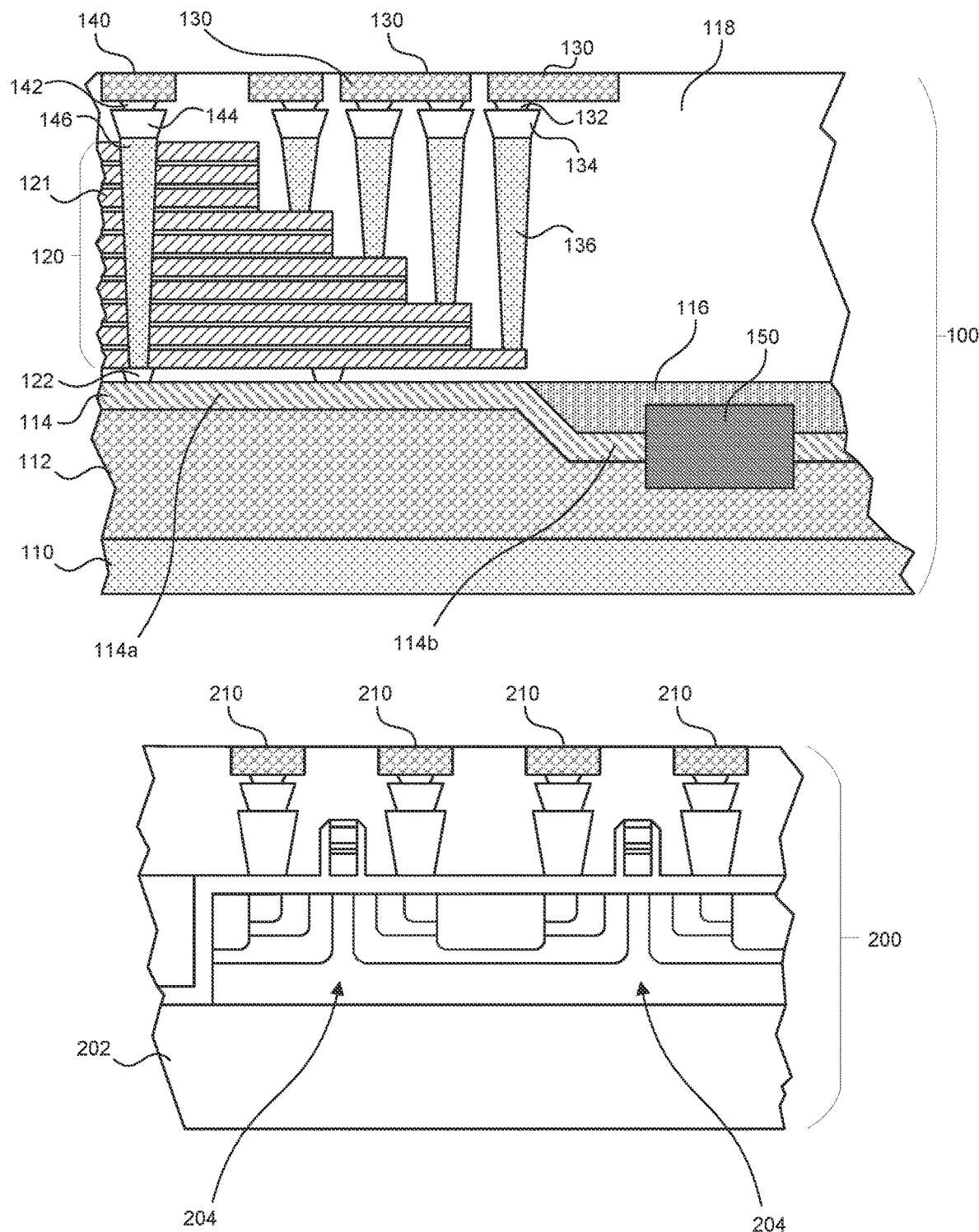
FIGS. 1A-1E are enlarged cross-sectional views showing various stages of fabricating a semiconductor device having a front-end-of-line interconnect structure in accordance with embodiments of the present technology.
Figure 1B:
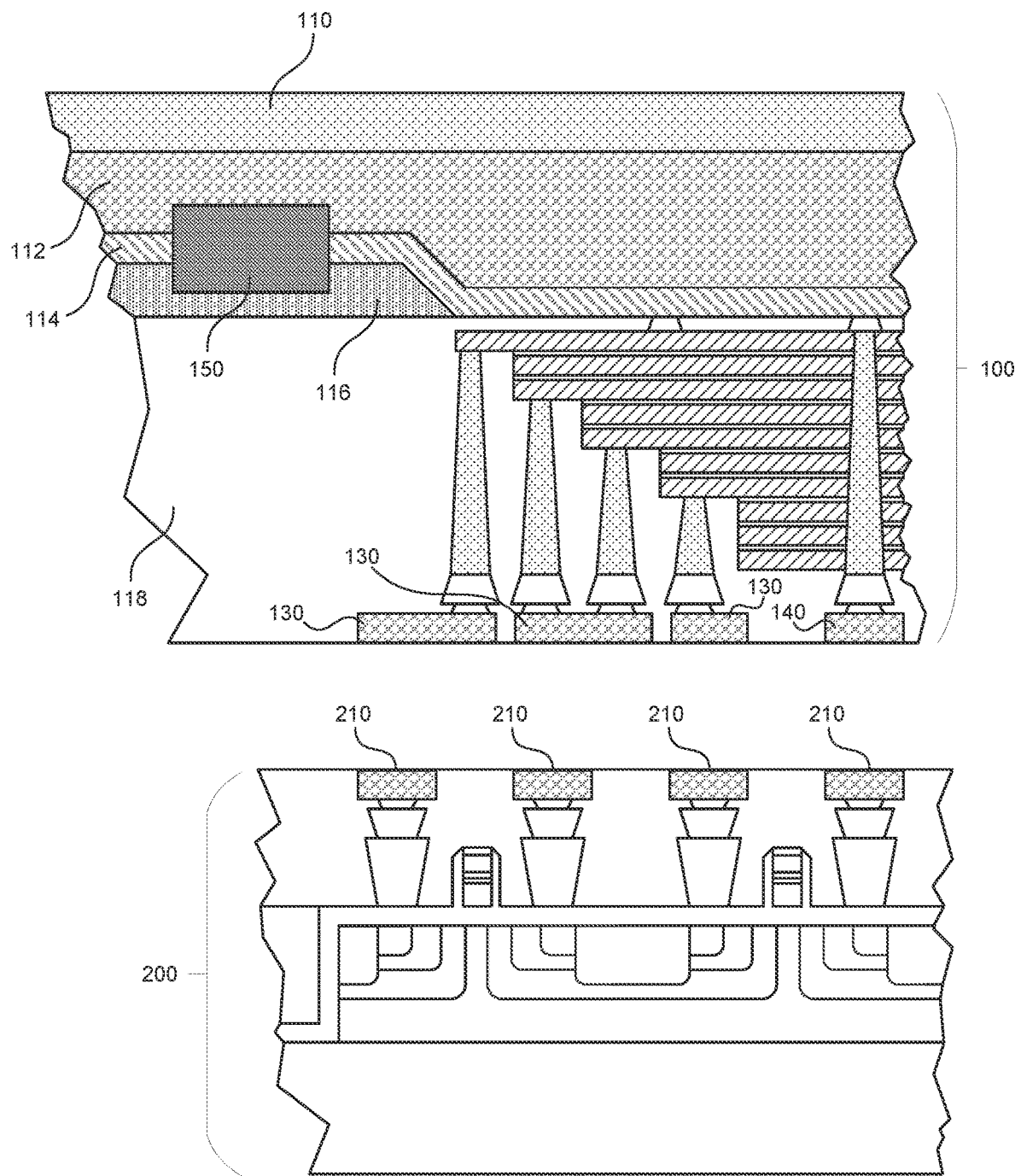

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having an interconnect structure for backside electrical connection formed (e.g., "pre-positioned") during front-end-of-line (FEOL) processing. FEOL is the stage of integrated circuit fabrication in which individual devices (transistors, capacitors, resistors, etc.) are formed at the active side of the semiconductor material. In contrast to the present technology, FEOL processes occur before fabricating metal interconnect structures at the backside. Conventional semiconductor device packages use back-end-of-line (BEOL) processing to form contact pads, through silicon vias, interconnect wires, and/or dielectric structures. During BEOL processing, metals and/or dielectric materials are deposited on the wafer to create contacts, insulating materials, metal levels, and/or bonding sites for chip-to-chip and chip-to-package connections. After BEOL processing, a probe stage is performed to physically acquire signals from the internal nodes of a semiconductor device for failure analysis and defect detection. Following the probe stage, post-probe processing is performed, which includes processes on the front side and/or the backside, including, e.g., three-dimensional integration (3DI) processing among other processing.

The present technology is generally directed to forming an interconnect structure during FEOL processing (e.g., gate level processing) at or near the active side of the die and exposing or otherwise accessing the pre-positioned interconnect structure during BEOL or post-probe processing with ultra-thin silicon processing or total silicon removal. In some embodiments, the present technology eliminates the need for forming BEOL TSVs, allows direct-to-device routing, and enables ultra-thin die stacking among other advantages over conventional process. In some embodiments, a shallow interconnect area is positioned deeper than a shallow trench isolation (STI) structure and is formed in or on the substrate during first level FEOL processing. The FEOL processed interconnect or interconnect area has an active contact surface that is at least partially buried within the substrate material and/or dielectric materials during at least a portion of the FEOL processing. The FEOL interconnect is then revealed for access from the backside during BEOL or post-probe processing.

Various FEOL interconnect configurations are within the scope of the present technology, such as array, sacrificial oxide, etc., or any combination thereof. Processing of three-dimensional integration (3DI) using the present technology is expected to reduce cost and provide a high degree of design flexibility for routing and other structures. For example, backside routing components can be formed during FEOL processing and accessed for electrical connection through the substrate during BEOL or post-probe processing, as will be described below. In contrast, conventional processing requires forming backside routing components by patterning, etching, and filling deep holes in the silicon material to create through silicon vias during BEOL processing, which poses various challenges, e.g., etching and filling relatively deep holes, processing without damaging thin layers, layout design limitations, etc. In these regards, interconnects of the present technology are more directly integrated than conventional device connections. Some embodiments can be applied to bonded microelectronic devices, such as NAND circuits, among others. In these configurations, separate complementary metal-oxide-semiconductor (CMOS) and array chips are bonded together face-to-face. During FEOL processing, a FEOL interconnect is pre-positioned in the silicon material and/or the dielectric materials of the array chip assembly and accessed for electrical connection through the backside of the array chip assembly. In some embodiments, the CMOS assembly includes periphery circuit devices that support the array, but generally does not include memory cells and access devices; and the array assembly includes wordlines, bitlines, access devices, and memory cells, but generally does not include periphery circuit devices such as drivers, latches, controllers, regulators, etc.

FIGS. 1A-1E show enlarged cross-sectional views of various stages of fabricating a semiconductor device comprising an array chip assembly 100 ("array assembly 100") and a CMOS chip assembly 200 (CMOS 200) in accordance with embodiments of the present technology. The array assembly 100 includes a substrate 110, such as a silicon, silica, or silicate substrate, on which various materials and components may be formed. The array assembly 100 also includes a dielectric material 112 on the substrate 110 and a metal conducting material 114 formed on at least a portion of the dielectric material 112. The dielectric material 112 can be silicon oxide or another non-conductive material grown or deposited on the substrate 110, or the dielectric material 112 can be a non-resin or other inorganic material capable of withstanding temperatures over 600° C. The electrically conducting material 114 can have line portion 114a and an interconnect structure 114b, where the interconnect structure 114b can have FEOL pre-positioned interconnect 150 ("FEOL interconnect"), such as a 3Dx contact. The FEOL interconnect 150 is at least partially embedded within the dielectric material 112 in this example. The array assembly can further include an additional dielectric material 116 on the side of the FEOL interconnect 150 opposite the dielectric material 112 to protect the FEOL interconnect 150 during processing.

The array assembly 100 may further include a 3D memory array 120 proximate the dielectric material 112 and having a plurality of stacked memory array layers 121 electrically coupled to the line portion 114a through one or more base pillars 122. Although illustrated with ten array layers 121 in a stacked configuration in the instant example, the 3D memory array 120 may have any number of array layers 121. The array assembly 100 may also have multi-height pillars 136 defining interconnects that electrically couple the array layers 121 to one or more first bond pads 130 through conductive traces/caps 132 and 134 (e.g., copper, solder, etc.). In some embodiments, the array assembly 100 may also include one or more second bond pads 140 electrically coupled to the line portion 114, for example using a TSV 146 connected to the second bond pad 140 through a conductive trace/cap 142 and 144. A dielectric material 118 may encase components of the semiconductor device, e.g., the 3D memory array 120, the pillars 136, the bond pads 130, 140, and 210, etc. Although one configuration of the array assembly 100 is depicted in the Figures, any suitable configuration of the array assembly 100 is also within the scope of the present technology.

Figure 1C:
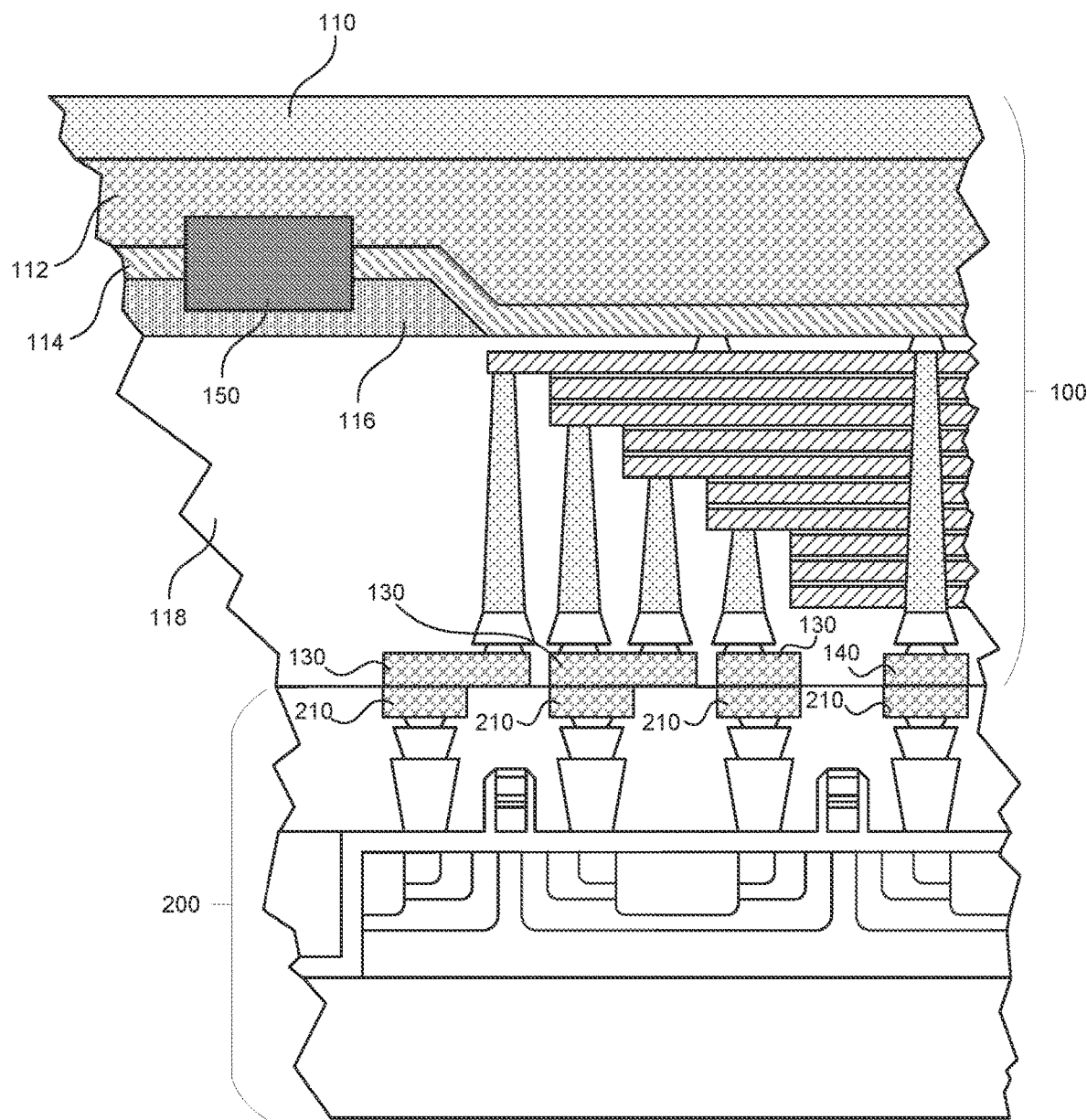

The CMOS 200 may be any suitable CMOS chip and includes a substrate 202, active electrical components 204 (e.g., transistor, etc.), and bond pads 210 configured to be electrically coupled to the bond pads of the array assembly 100. As shown in FIG. 1A, the array assembly 100 and the CMOS 200 are separately formed and prepared for bonding through the bond pads 130, 140, and 210. Next, in FIG. 1B, the array assembly 100 is flipped such that the array assembly 100 and the CMOS 200 are face-to-face to position the first and second bond pads 130 and 140 toward the bond pads 210. As shown, each bond pad of the array assembly 100 corresponds to a bond pad 210; however, in other embodiments some of the bond pads may be configured to bond to multiple bond pads in a bridging configuration. In FIG. 1C, the first and second bond pads 130 and 140 of the array assembly 100 are mated and bonded to the bond pads 210 of the CMOS 200 to form electrical connections between the array assembly 100 and the CMOS 200.

Figure 1D:
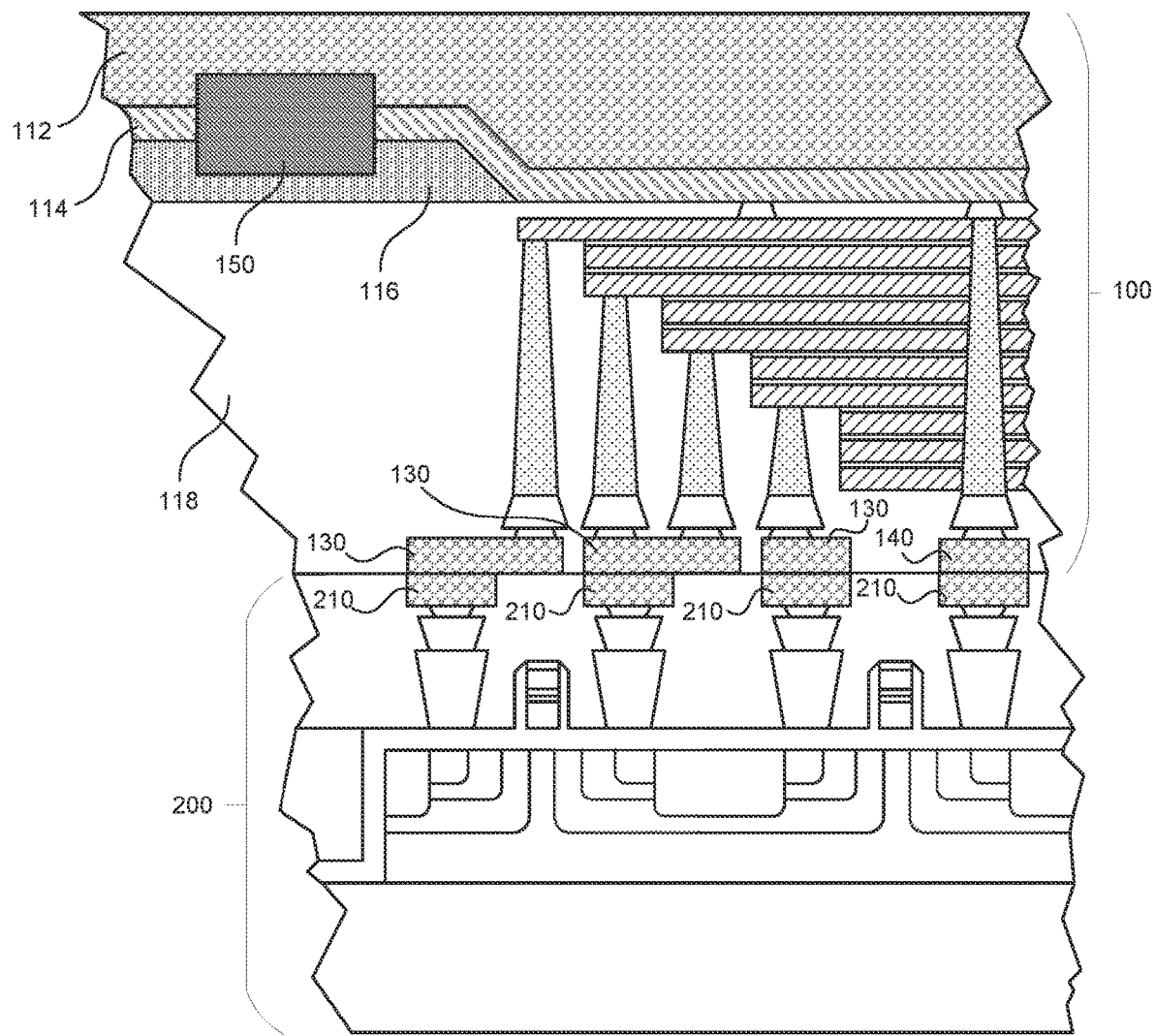
Figure 1E:
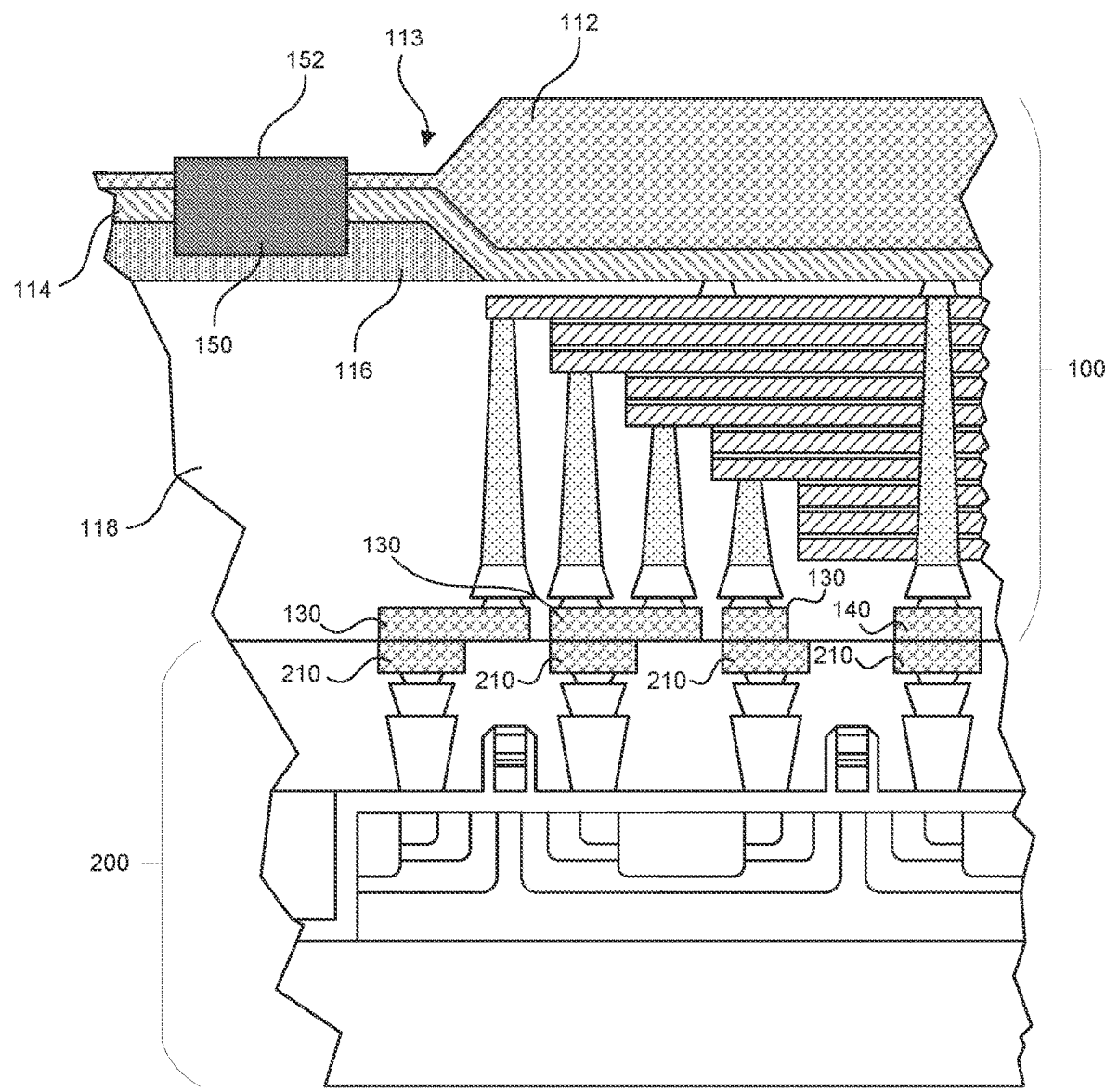

During BEOL, the FEOL interconnect 150 is exposed on the backside of the array assembly 100. As shown in FIG. 1D, the silicon substrate 110 is thinned or removed to expose at least a portion of the dielectric material 112. Next, in FIG. 1E, the dielectric material 112 is patterned and etched to form an opening 113 that exposes an active contact surface 152 of the FEOL interconnect 150 such that electrical connections can be made to the components of the array assembly 100 and the CMOS 200 from the backside of the array assembly 100. Once exposed, the FEOL interconnect 150 can be patterned to create bond pads (not shown) for further interconnects, to receive solder balls, etc. Although one configuration of an FEOL interconnect is shown, other configurations are within the scope of the present technology.

FIGS. 2A-2F show enlarged cross-sectional views of semiconductor devices having an FEOL interconnect structure configured in accordance with additional embodiments of the present technology. FIGS. 2A-2F show array chip assemblies 300-800, respectively, which are similar in overall structure and configuration to the array assembly 100 of FIGS. 1A-1E, except that the array chip assemblies 300-800 show several possible variations of FEOL interconnects. The configurations of the FEOL interconnects in FIGS. 2A-2F are intended to illustrate some of the variations in the FEOL interconnects; however, further suitable variations are within the scope of the present technology. In these embodiments, similar steps to those in FIGS. 1A-1E have already been performed to the semiconductor device (e.g., bonding, removal of the substrate, and etching of the insulating material, etc.), such that the exposed FEOL interconnect is shown. The CMOS 200 remains the same configuration as in FIGS. 1A-1E. Like reference numbers refer to similar features in FIGS. 2A-2F, but are in the 300-800-series, respectively, and the features may have variations and/or have different shapes and sizes.

Figure 2A:
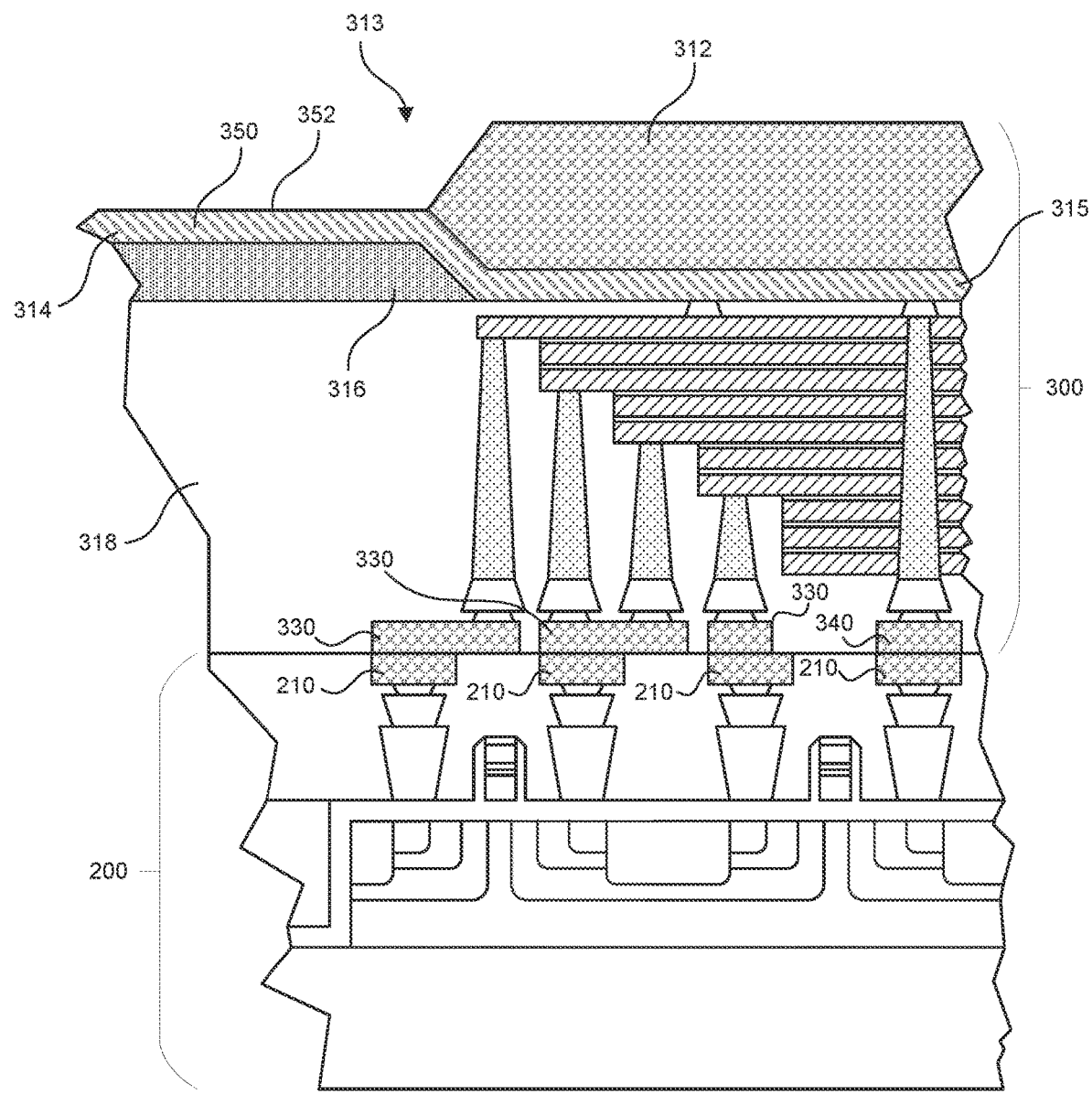
FIGS. 2A-2F are enlarged cross-sectional views showing semiconductor devices having a front-end-of-line interconnect structure in accordance with embodiments of the present technology.

FIG. 2A shows an embodiment of an array chip assembly 300 ("array assembly 300") bonded to the CMOS 200. In this configuration, a portion of a dielectric material 312 is removed to form an opening 313 and thereby expose a portion of a metal conducting material 314 formed in the array assembly 300. The conducting material 314 has a line portion 315 and an FEOL pre-positioned interconnect 350 defined by a distal portion of the conducting material 314, which can be a 3Dx contact. The FEOL interconnect has a contact surface 352 through which electrical connections can be made to the components of the array assembly 300 and the CMOS 200 from the backside of the array assembly 300. Once exposed, the contact surface 352 of the FEOL interconnect 350 can be patterned to create bond pads (not shown) for further interconnects, to receive solder balls, etc.

Figure 2B:
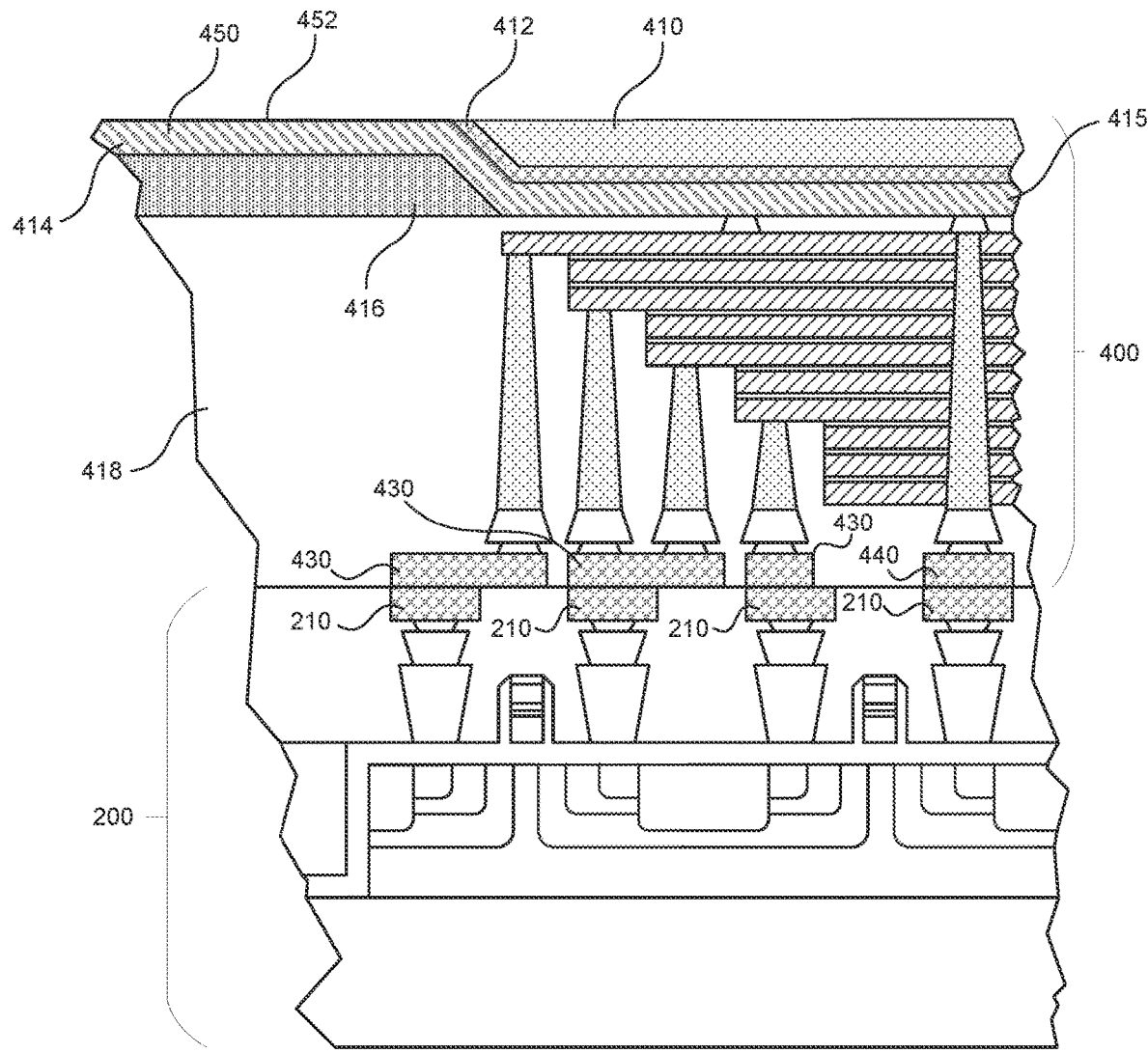

FIG. 2B shows an embodiment of an array chip assembly 400 ("array assembly 400") bonded to the CMOS 200. In this configuration, a dielectric material 412 is thinner than the dielectric material 312 of FIG. 2A, and the dielectric material 412 follows the sloped contour of a metal conducting material 414 such that a portion of a substrate 410 remains after, e.g., ultra-thin silicon processing. The conducting material 414 can have a line portion 415 and an FEOL pre-positioned interconnect 450 defined by a distal portion of the conducting material 414. A portion of the substrate 410 and a portion of the insulating material 412 are removed to expose the conducting material 414 at the FEOL interconnect 450. The exposed portion of the FEOL interconnect 450 has a contact surface 452 through which electrical connections can be made to the components of the array assembly 400 and the CMOS 200 from the backside of the array assembly 400. Once exposed, the contact surface 452 of the FEOL interconnect 450 can be patterned to create bond pads (not shown) for further interconnects, receive solder balls, etc. Since some of the substrate 410 remains after exposing the FEOL interconnect 450, the substrate 410 can be doped such that further devices can be built in the remaining substrate material 410 to provide additional configurations of the semiconductor device.

Figure 2C:
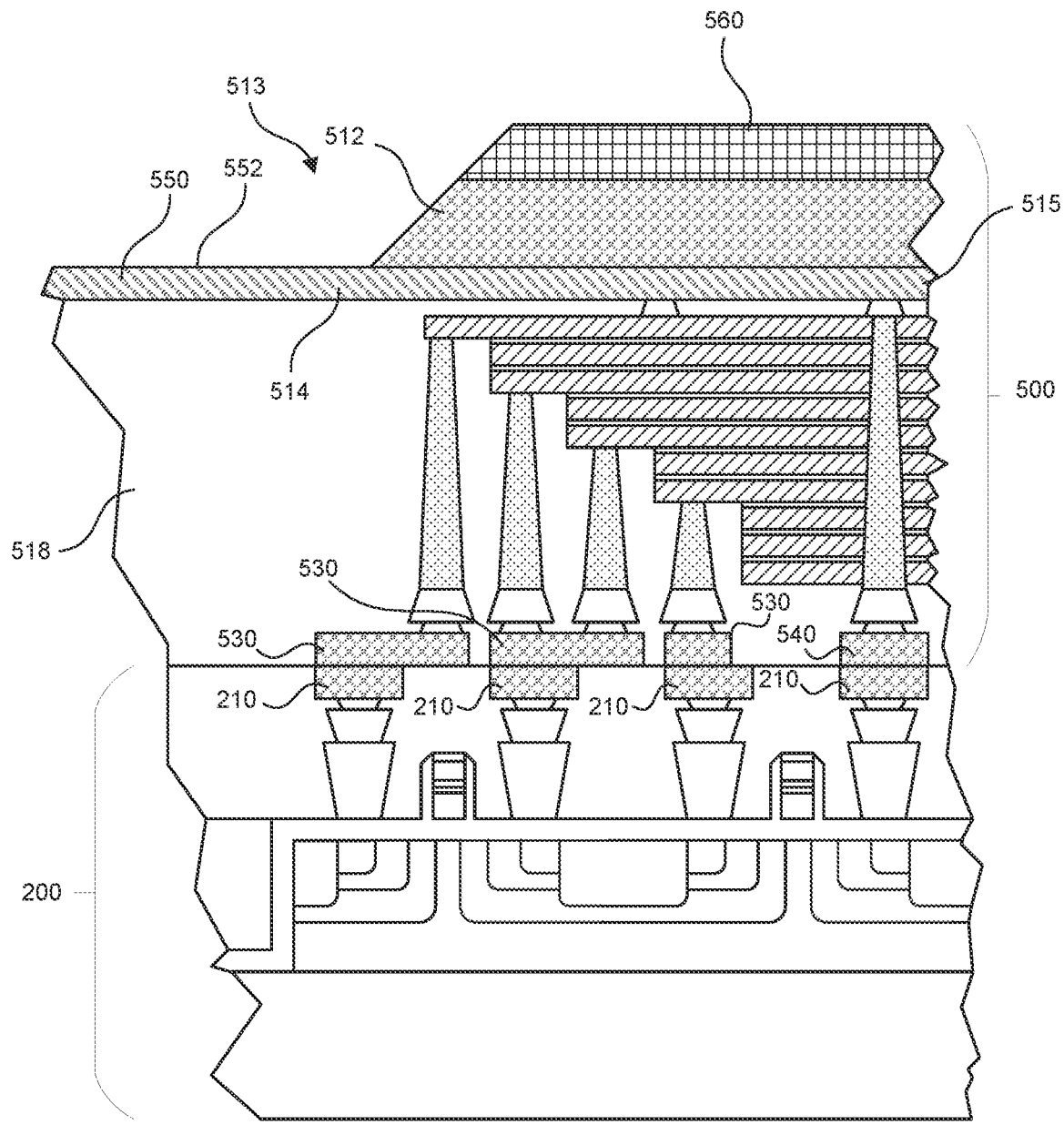

FIG. 2C shows an embodiment of an array chip assembly 500 ("array assembly 500") bonded to the CMOS 200. The array assembly 500 has planar electrical conducting material 514 with a line portion 515 and an FEOL interconnect 550 defined by a distal end of the conducting material 514. In this configuration, a portion of a dielectric insulating material 512 is removed to form an opening 513 and thereby expose a contact surface 552 of the FEOL interconnect 550. An additional insulating material 560 is formed on the insulating material 512. The metal conducting material 514 has a planar configuration without a slope. The contact surface 552 can be coupled to electrical connectors through which electrical connections can be made to the components of the array assembly 500 and the CMOS 200 from the backside of the array assembly 500. Once exposed, the contact surface 552 of the FEOL interconnect 550 can be patterned to create bond pads (not shown) for further interconnects, to receive solder balls, etc.

Figure 2D:
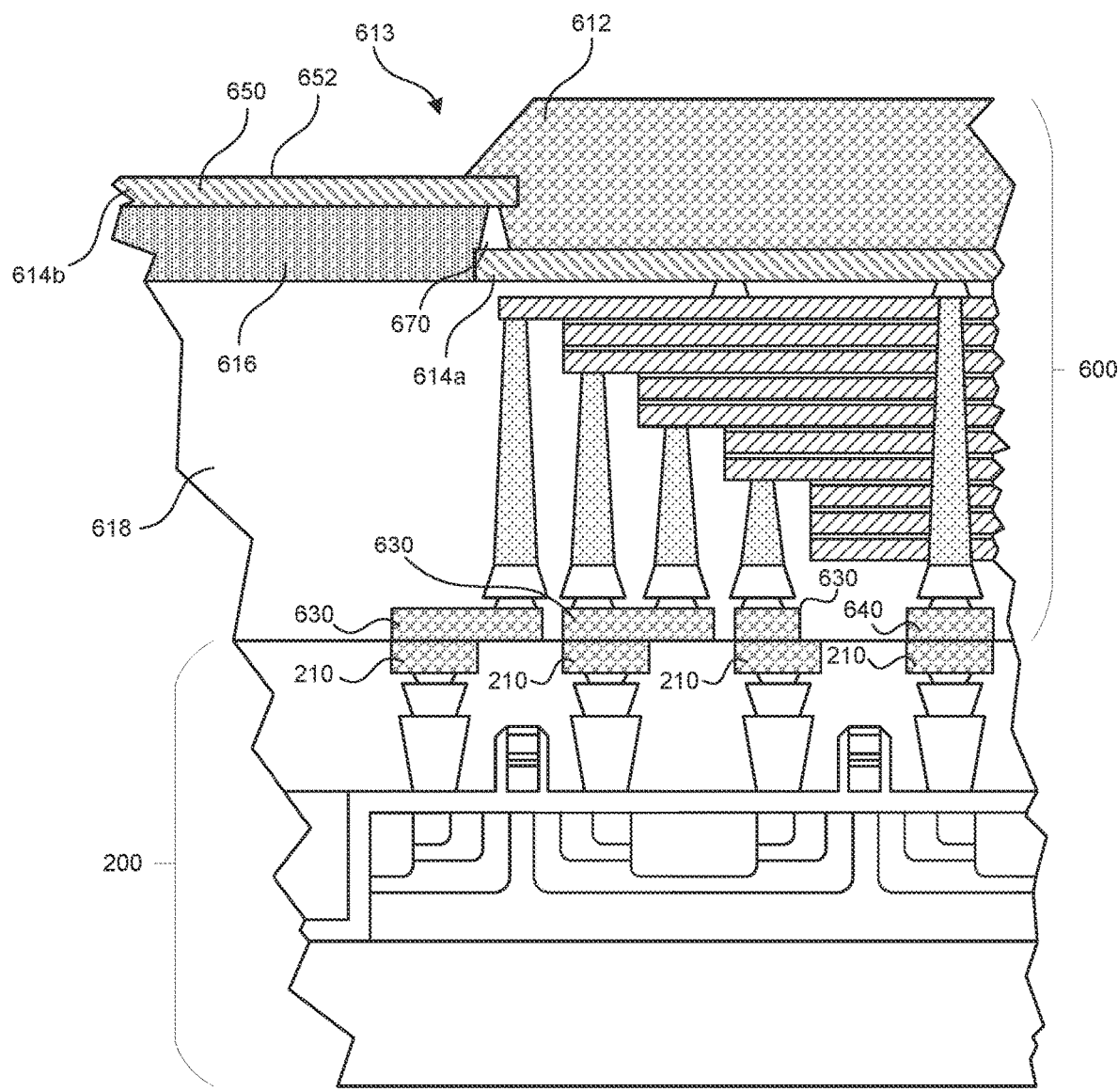

FIG. 2D shows an embodiment of an array chip assembly 600 ("array assembly 600") bonded to the CMOS 200. In this configuration, a metal conducting material 614 comprises a first metal conducting material 614a (e.g., a line portion) and a second metal conducting material 614b at a different level in the array assembly 600 than the first metal conducting material 614a. The first and second conducting materials 614a and 614b can be electrically connected to each other by an interconnect 670. The second conducting material 614b defines an FEOL pre-positioned interconnect 650 having a contact surface 652. During processing, a portion of a dielectric insulating material 612 is removed to form an opening 613 and thereby expose the contact surface 652. The FEOL interconnect 650 enables electrical connections to be made to the components of the array assembly 600 and the CMOS 200 from the backside of the array assembly 600. Once exposed, the contact surface 652 of the FEOL interconnect 650 can be patterned to create bond pads (not shown) for further interconnects, to receive solder balls, etc.

Figure 2E:
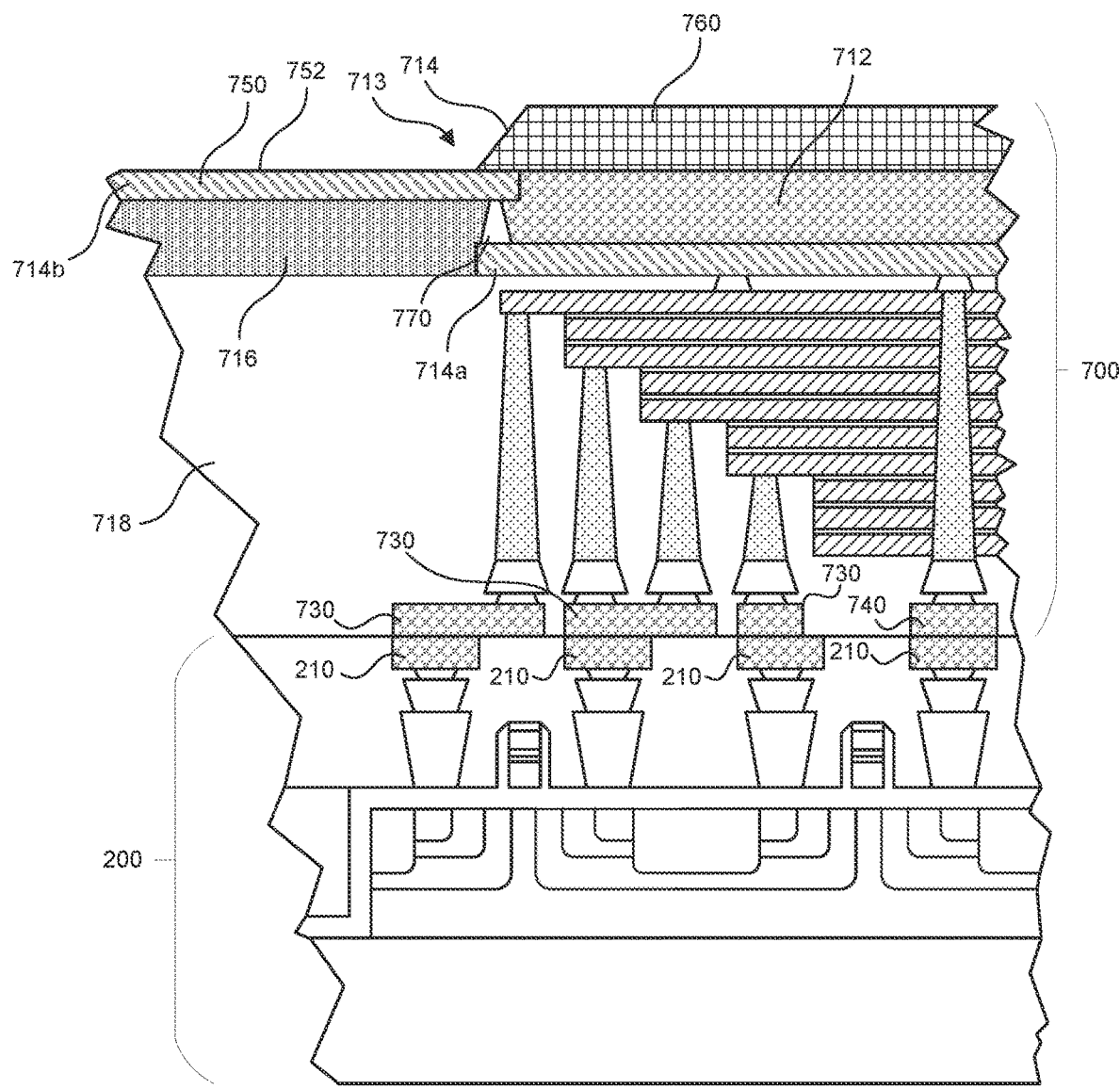

FIG. 2E shows an embodiment of an array chip assembly 700 ("array assembly 700") bonded to the CMOS 200. The assembly 700 has a metal conducting material 714 comprising a first metal conducting material 714a and a second metal conducting material 714b at different levels in the array assembly 700. The first and second conducting materials 714a and 714b are electrically connected to each other by an interconnect 770. The second conducting material 714b defines an FEOL pre-positioned interconnect 750 having a contact surface 752. During processing, a portion of a dielectric insulating material 712 is removed to form an opening 713 having a sidewall 714 that exposes the contact surface 752. In this configuration, an additional insulating material 760 is formed on the insulating material 712. The contact surface 752 can be configured to electrically couple the components of the array assembly 700 and the CMOS 200 to other components (e.g., a package substrate) from the backside of the array assembly 700. For example, the contact surface 752 of the FEOL interconnect 750 can be patterned to create bond pads (not shown) for further interconnects, to receive solder balls, etc.

Figure 2F:
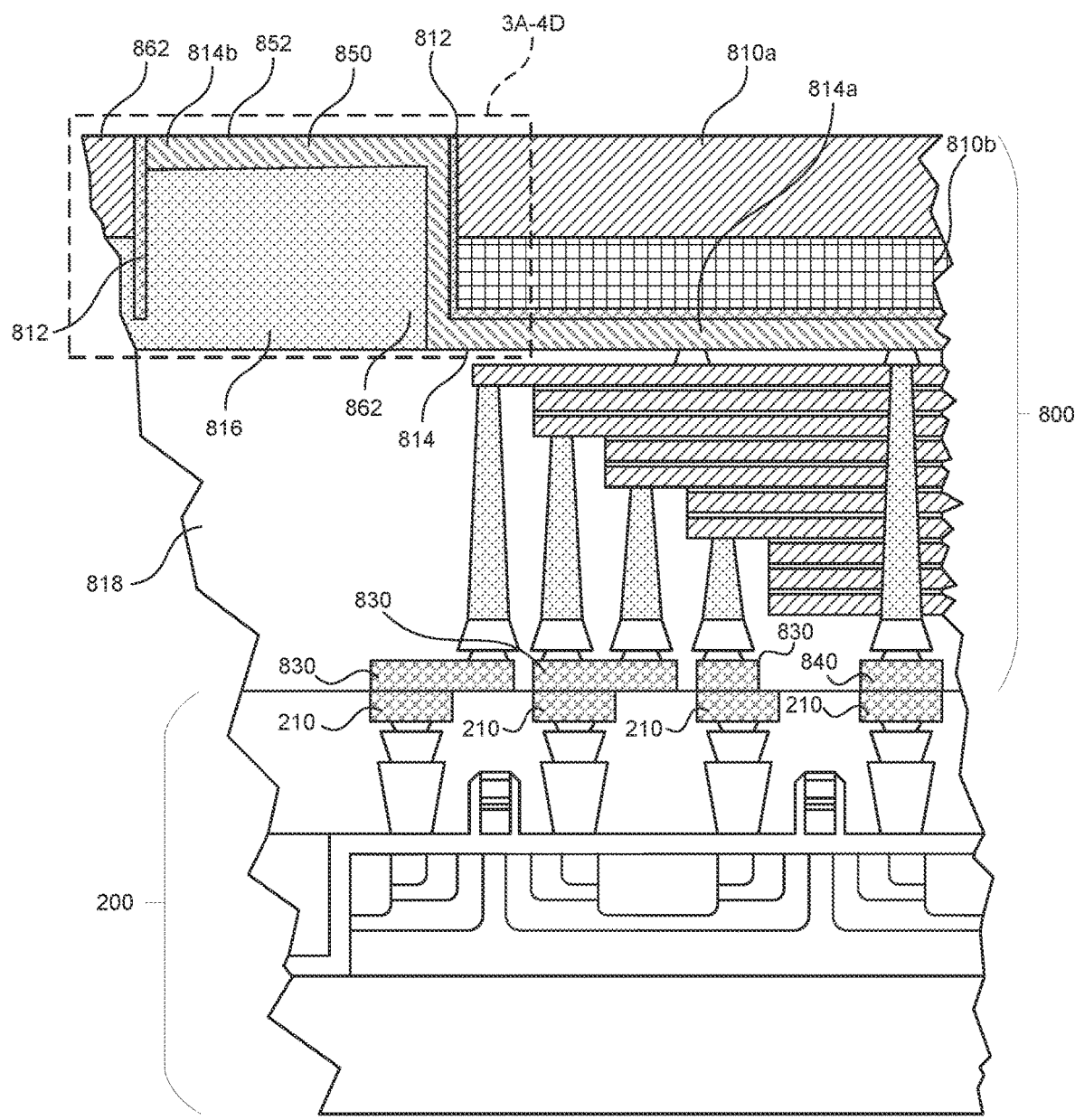

FIG. 2F shows an embodiment of an array chip assembly 800 ("array assembly 800") bonded to the CMOS 200. In this configuration, a dielectric insulating material 812 is thin and follows the stepped contour of a metal conducting material 814 such that a portion of a substrate 810 remains after, e.g., ultra-thin silicon processing. The substrate 810 may include a first substrate material 810a and a second substrate material 810b, each having different levels of doping. The metal conducting material 814 can have a line portion 814a and an interconnect structure 814b, and the conducting material 814 can have trench 862 in which an additional dielectric insulating material 816 may be formed. A portion of the substrate 810 and a portion of the insulating material 812 are removed to expose a portion of the conducting material 814 formed in the array assembly 800. The interconnect structure 814b defines an FEOL pre-positioned interconnect 850 having a contact surface 852 through which electrical connections can be made to the components of the array assembly 800 and the CMOS 200 from the backside of the array assembly 800. The contact surface 852 of the FEOL interconnect 850 can be patterned to create bond pads (not shown) for further interconnects, receive solder balls, etc. Since some of the substrate 810 remains after exposing the FEOL interconnect 850, the first substrate material 810a can be doped such that further devices can be built in the remaining substrate materials 810a and/or 810b to provide additional configurations of the semiconductor device.

FIGS. 3A-3D show enlarged cross-sectional views of semiconductor devices having FEOL pre-positioned interconnects configured in accordance with additional embodiments of the present technology. FIGS. 3A-3D show a portion of an array chip assembly 1000 ("array assembly 1000"), e.g., the portion of the array assembly 800 defined by the broken line border 3A-4D shown in FIG. 2F. The array assembly 1000 is similar in overall structure and configuration to the array assemblies 100 and 800 of FIGS. 1A-1E and 2F, respectively, except that the array assembly 1000 shows additional variations in the FEOL interconnects and selected steps of creating contact with the FEOL interconnects. Further suitable variations are within the scope of the present technology. In these embodiments, some of the steps shown in FIGS. 1A-1E have already been performed (e.g., bonding to the CMOS, etc.). Like reference numbers refer to similar features in FIGS. 3A-3D, but are in the 1000-series, and the features may have variations and/or have different shapes and sizes.

FIG. 3A shows an embodiment of the array assembly 1000 which may be bonded to a CMOS assembly (not shown). The array assembly 1000 includes a substrate 1010, such as a silicon, silica, or silicate substrate, on which various materials and components may be formed. The substrate 1010 may include multiple regions with different levels of doping, such as a first substrate region 1010a (e.g., a bulk silicon region), a second substrate region 1010b (e.g., an implant region), and a third substrate region 1010c (e.g., an additional implant region having a different doping level than the second substrate region 1010b). In other embodiments, the substrate 1010 has any number of different doping materials/regions, or a single level of doping throughout. The array assembly 1000 includes a dielectric insulating material 1012 and a metal conducting material 1014 formed within the regions of the substrate 1010. The distal portion of the conducting material 1014 defines an FEOL pre-positioned interconnect structure 1050 that is at least partially formed within the insulating material 1012. An additional dielectric insulating material 1016 may be formed in a trench 1062.

FIG. 3B shows the array assembly 1000 in an inverted position relative to the position shown in FIG. 3A and after a portion of the first substrate material 1010a and a portion of the insulating material 1012 have been removed to expose a the distal portion of the conducting material 1014. The FEOL pre-positioned interconnect structure 1050 has a conductive surface 1052 through which electrical connections can be made to the components of the array assembly 1000 and the CMOS (not shown) from the backside of the array assembly 1000. The conductive surface 1052 of the FEOL interconnect 1050 may have protrusions 1090 that increase the surface area for adhesion, etc.

FIG. 3C shows the array assembly 1000 after an additional insulating material 1060 has been formed on the insulating material 1012 and patterned/etched to form an opening 1064 that exposes the conductive surface 1052 of the FEOL interconnect 1050. FIG. 3D shows the array assembly 1000 after a backside metal material 1094 has been deposited and electrically coupled to the contact surface 1052. The backside metal 1094 is accordingly a contact feature of the FEOL interconnect 1050.

FIGS. 4A-4D show enlarged cross-sectional views of semiconductor devices having an FEOL pre-positioned interconnect configured in accordance with additional embodiments of the present technology. FIGS. 4A-4D show a portion of an array chip assembly 1100 ("array assembly 1100"), e.g., the portion of the array assembly 800 defined by the broken line border 3A-4D shown in FIG. 2F. The array assembly 1100 is similar in overall structure and configuration to the array assemblies 100 and 800 of FIGS. 1A-1E and 2F, respectively, except that the array assembly 1100 shows an additional variation for an FEOL interconnect and selected steps of forming the FEOL interconnect. Further suitable variations are within the scope of the present technology. In these embodiments, some of the steps shown in FIGS. 1A-1E have already been performed (e.g., bonding to the CMOS, etc.). Like reference numbers refer to similar features in FIGS. 4A-4D, but are in the 1100-series and the features may have variations and/or have different shapes and sizes.

Figure 4A:
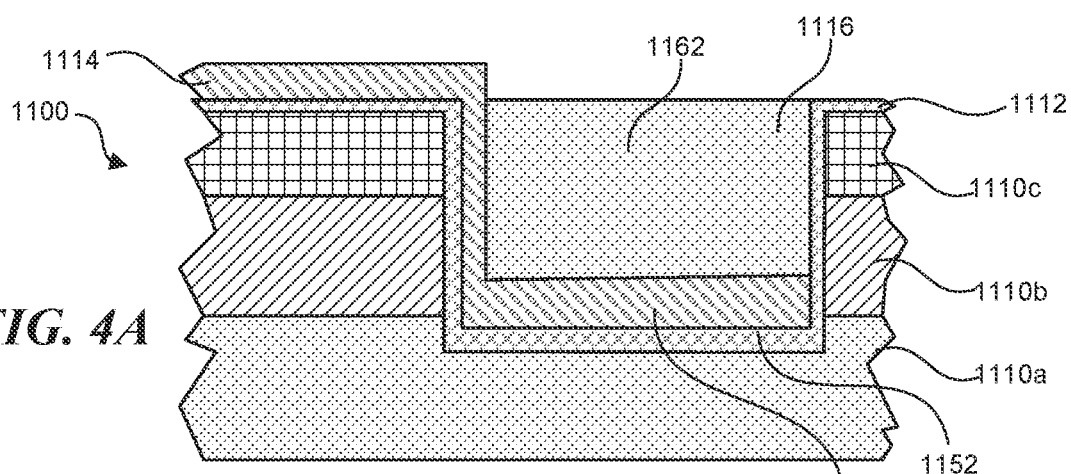
FIGS. 4A-4D are enlarged cross-sectional views of the portion of the semiconductor device shown in FIG. 2F, showing various stages of fabricating a semiconductor device having a front-end-of-line interconnect structure in accordance with embodiments of the present technology.

FIG. 4A shows an embodiment of the array assembly 1100 which may be bonded to a CMOS assembly (not shown). The array assembly 1100 includes a substrate 1110, such as a silicon, silica, or silicate substrate, on which various materials and components may be formed. The substrate 1110 may include multiple regions with different levels of doping, such as a first substrate region 1110a (e.g., a bulk silicon region), a second substrate region 1110b (e.g., an implant region), and a third substrate region 1110c (e.g., an additional implant region having a different doping level than the second substrate region 1110b). In other embodiments, the substrate 1110 has any number of different doping materials/regions, or a single level of doping throughout. The array assembly 1100 includes a dielectric material 1112 and a metal conducting material 1114 formed within the regions of the substrate 1110. The conducting material 1114 has a line portion and an FEOL pre-positioned interconnect structure 1150 with a contact surface 1152. An additional dielectric insulating material 1116 may be formed in a trench 1162.

Figure 4B:
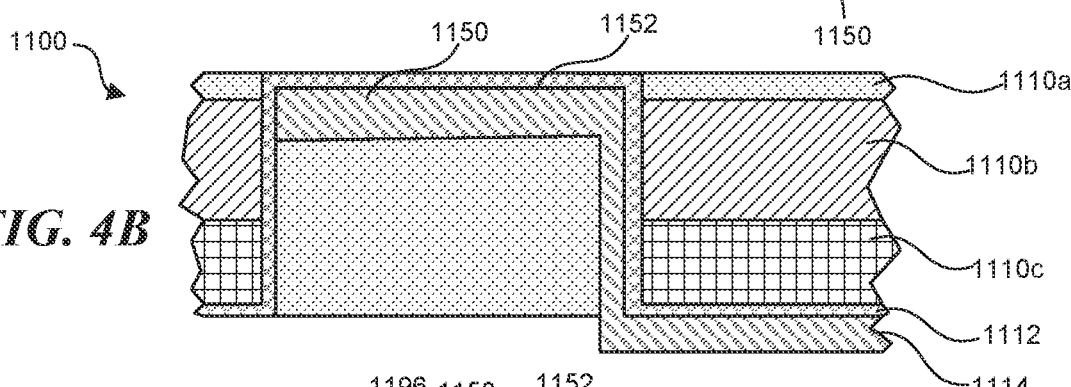
Figure 4C:
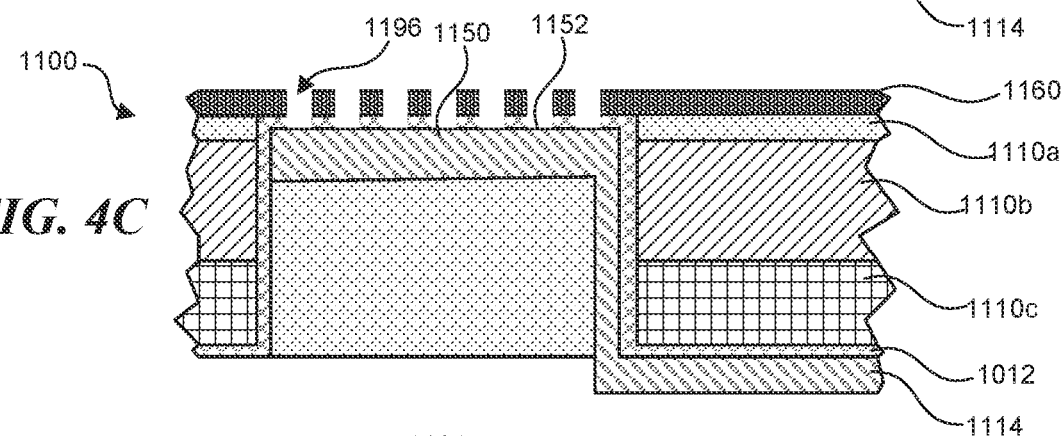
Figure 4D:
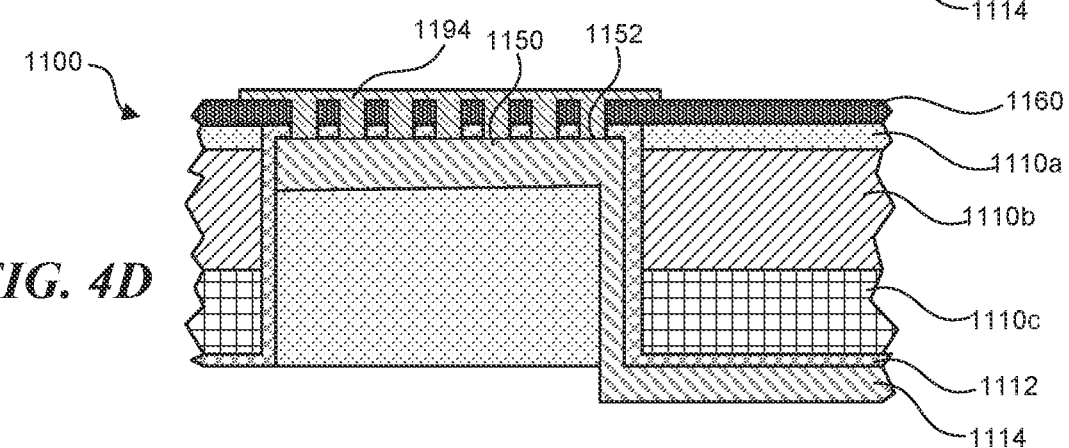

FIG. 4B shows the array assembly 1100 after a portion of the first substrate region 1110a has been removed to expose a portion of the dielectric material 1112. As opposed to the embodiment shown in FIG. 3B, the dielectric material 1112 may remain after ultra-thin silicon processing. The line portion of the conducting material 1114 remains beneath the dielectric material 1112. The FEOL interconnect 1150 may be configured with a conductive surface 1152 for forming further interconnects, to receive solder balls, etc. FIG. 4C shows the array assembly 1100 after an additional insulating material 1160 has been formed on the dielectric material 1112, and a plurality of openings 1196 have been formed through the dielectric material 1112 and insulating material 1160 to expose the conductive surface 1152 of the FEOL interconnect 1150. FIG. 4D shows a backside metal deposition material 1194 filling the openings 1196 and contacting the conductive surface 1152 for electrically coupling the FEOL interconnect 1150 to other components (e.g., a package substrate or another device).

The interconnects described herein may be formed from suitable conductive materials, such as copper (Cu), and may have solder caps to form the electrical connections (e.g., tin-silver (SnAg) solder caps). During assembly, the solder cap can be reflowed using gang reflow, sonic reflow, or other techniques. The bond pads can be copper pads and may be bonded using copper-to-copper bonding or other suitable techniques.

Figure 5:
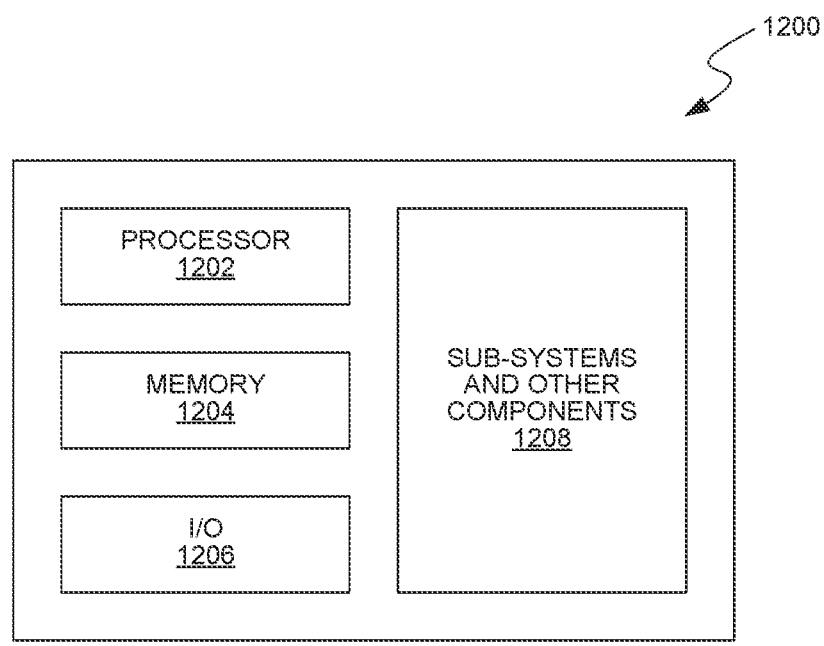
FIG. 5 is a schematic view of a system that includes a semiconductor device in accordance with embodiments of the present technology.

FIG. 5 is a block diagram illustrating a system that incorporates a semiconductor device in accordance with embodiments of the present technology. Any one of the semiconductor devices having the features described above with reference to FIGS. 1A-4D can be incorporated into any of a myriad of larger and/or more complex systems, a representative example of which is system 1200 shown schematically in FIG. 5. The system 1200 can include a processor 1202, a memory 1204 (e.g., SRAM, DRAM, flash, and/or other memory devices), input/output devices 1206, and/or other subsystems or components 1208. The semiconductor assemblies, devices, and device packages described above with reference to FIGS. 1A-4D can be included in any of the elements shown in FIG. 5. The resulting system 1200 can be configured to perform any of a wide variety of suitable computing, processing, storage, sensing, imaging, and/or other functions. Accordingly, representative examples of the system 1200 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1200 include lights, cameras, vehicles, etc. In these and other examples, the system 1200 can be housed in a single unit or distributed over multiple interconnected units, e.g., through a communication network. The components of the system 1200 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device, comprising:
a dielectric material having a backside formed on a front side of a semiconductor substrate material and a front side opposite the backside;
a conducting material on at least a portion of the front side of the dielectric material, the conducting material having a line portion and an interconnect structure electrically coupled to the line portion, and the interconnect structure having a backside defining an active contact surface and a front side opposite the backside;
a semiconductor memory array proximate the front side of the dielectric material and electrically connected to the line portion of the conducting material;
an insulating material encasing at least a portion of the semiconductor memory array; and
an opening through which the active contact surface at the backside of the interconnect structure is exposed for electrical connection,
wherein the conducting material has a first horizontal portion and a second horizontal portion arranged nearer the front side of the substrate material than the first horizontal portion,
wherein the first and second horizontal portions of the conducting material are continuous and coupled with a sloped portion of the conducting material; and
wherein the interconnect structure portion is positioned on the second horizontal portion of the conducting material.

2. The semiconductor device of claim 1, wherein the dielectric material comprises silicon dioxide.

3. The semiconductor device of claim 1, further comprising a passive insulating material formed on the dielectric material.

4. The semiconductor device of claim 1, further comprising a backside metal deposition material formed on the active contact surface.

5. The semiconductor device of claim 1 wherein the dielectric material comprises a non-resin material.

6. The semiconductor device of claim 1, wherein:
the semiconductor memory array comprises a base array layer and additional array layers stacked on the base array layer to define a stacked memory array, and the semiconductor device includes bond pads electrically coupled to the stacked memory array; and
a CMOS chip assembly electrically coupled to the stacked memory array via the bond pads.

7. The semiconductor device of claim 6, wherein, when the stacked memory array and the CMOS chip assembly are bonded, the active contact surface of the interconnect structure portion is electrically coupled to a component of the CMOS chip assembly.

8. The semiconductor device of claim 1, further comprising a secondary insulating material formed on a front side of the conducting material.

9. The semiconductor device of claim 1, wherein a portion of the substrate material is arranged on a backside of the insulating material nearer the second horizontal portion of the conducting material than the active contact surface such that a portion of the substrate material remains coupled to the insulating material after exposure the active contact surface.

10. The semiconductor device of claim 1, wherein:
   the conducting material forms a trench on a front side of the conducting material; and
   the trench contains a trench insulating material.

11. The semiconductor device of claim 1, wherein the interconnect structure further comprises a bond pad extending from the active contact surface.

\* \* \* \* \*